United States Patent
Hwang et al.

(10) Patent No.: US 9,887,089 B2
(45) Date of Patent: Feb. 6, 2018

(54) SEMICONDUCTOR STRUCTURES HAVING T-SHAPED ELECTRODES

(71) Applicant: Raytheon Company, Waltham, MA (US)

(72) Inventors: Kiuchul Hwang, Amherst, NH (US);
Dale M. Shaw, Groton, MA (US);
Adrian D. Williams, Methuen, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/285,782

(22) Filed: Oct. 5, 2016

(65) Prior Publication Data
US 2017/0025278 A1    Jan. 26, 2017

Related U.S. Application Data

(62) Division of application No. 14/184,793, filed on Feb. 20, 2014, now abandoned.

(51) Int. Cl.
| | |
|---|---|
| *H01L 21/28* | (2006.01) |
| *H01L 21/033* | (2006.01) |
| *H01L 21/768* | (2006.01) |
| *H01L 51/00* | (2006.01) |
| *H01L 21/285* | (2006.01) |
| *H01L 29/423* | (2006.01) |
| *H01L 21/283* | (2006.01) |

(52) U.S. Cl.
CPC ...... *H01L 21/28114* (2013.01); *H01L 21/283* (2013.01); *H01L 21/28587* (2013.01); *H01L 29/42316* (2013.01)

(58) Field of Classification Search
CPC ............ H01L 21/28114; H01L 21/283; H01L 21/28557; H01L 21/0272; H01L 21/0331; H01L 21/0332; H01L 21/0337; H01L 21/7688; H01L 51/0016; H01L 2224/0347; H01L 2224/03472
See application file for complete search history.

(56) References Cited

U.S. PATENT DOCUMENTS

| | | |
|---|---|---|
| 5,652,157 A | 7/1997 | Hirano |
| 5,858,824 A | 1/1999 | Saitoh |
| 6,051,454 A | 4/2000 | Anda et al. |
| 6,740,535 B2 | 5/2004 | Singh et al. |
| 2003/0119233 A1 | 6/2003 | Koganei |

(Continued)

OTHER PUBLICATIONS

PCT Notification of Transmittal of International Preliminary Report on Patentability (Chapter I of the Patent Cooperation Treaty) PCT/US2015/013445; dated Sep. 1, 2016, 1 page.

(Continued)

*Primary Examiner* — Thanhha Pham
(74) *Attorney, Agent, or Firm* — Daly, Crowley, Mofford & Durkee, LLP

(57) ABSTRACT

A semiconductor structure having a T-shaped electrode. The electrode has a top portion and a narrower stem portion extending from the top portion to a surface of a substrate. A solid dielectric layer has side portions juxtaposed and abutting sidewalls of a lower portion of the stem of electrode. A bottom surface of the top portion is spaced from an upper surface portion by a non-solid dielectric, such as air.

7 Claims, 7 Drawing Sheets

(56) References Cited

U.S. PATENT DOCUMENTS

2006/0223294 A1* 10/2006 Makiyama .............. G03F 7/094
438/590
2012/0049243 A1 3/2012 Wu

OTHER PUBLICATIONS

PCT International Preliminary Report on Patentability, PCT/US2015/013445; dated Aug. 23, 2016, 1 page.
PCT Written Opinion of the ISA, PCT/US2015/013445; dated Jul. 13, 2015, 9 pages.
L.K. Hanes, B.E. Ostrowski, A.R. StGermain, D. Shaw, K. Alavi, Transition of 0.15 µm T-Gates to Manufacturing, Raytheon Company, Advanced Device Center, Andover, Massachusetts, GaAs Mantech, 1998, pp. 165-168 (4 pages).
Invitation to Pay Additional Fees, PCT/2015/013445, dated May 6, 2015, 7 pages.
PCT Notification of Transmittal of the International Search Report and the Written Opinion of the International Searching Authority dated Jul. 13, 2015, PCT/US2015/013445, 1 page.
PCT International Search Report of the International Searching Authority dated Jul. 13, 2015, PCT/US2105/013445, 6 pages.
PCT Written Opinion of the International Searching Authority dated Jul. 13, 2015, PCT/US2015/013445, 9 pages.

* cited by examiner

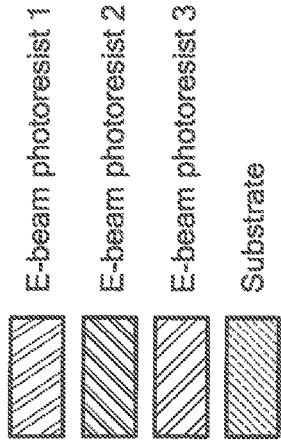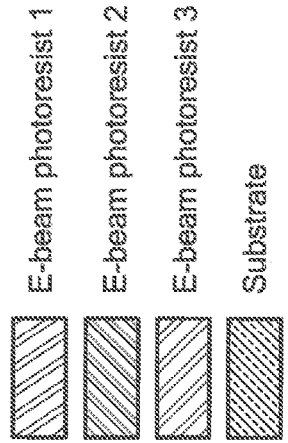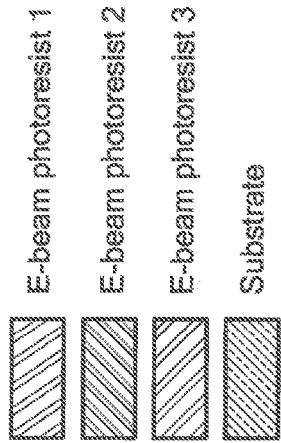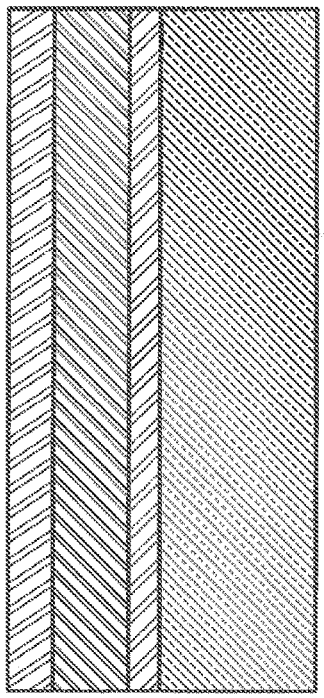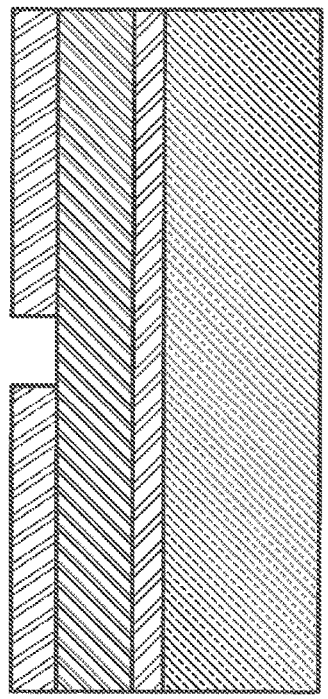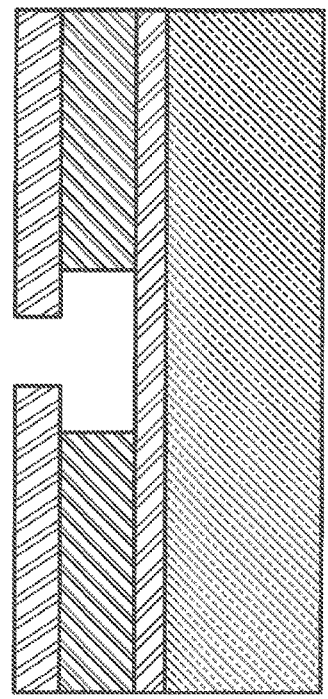
FIG. 1A
PRIOR ART
FIG. 1B
PRIOR ART
FIG. 1C
PRIOR ART

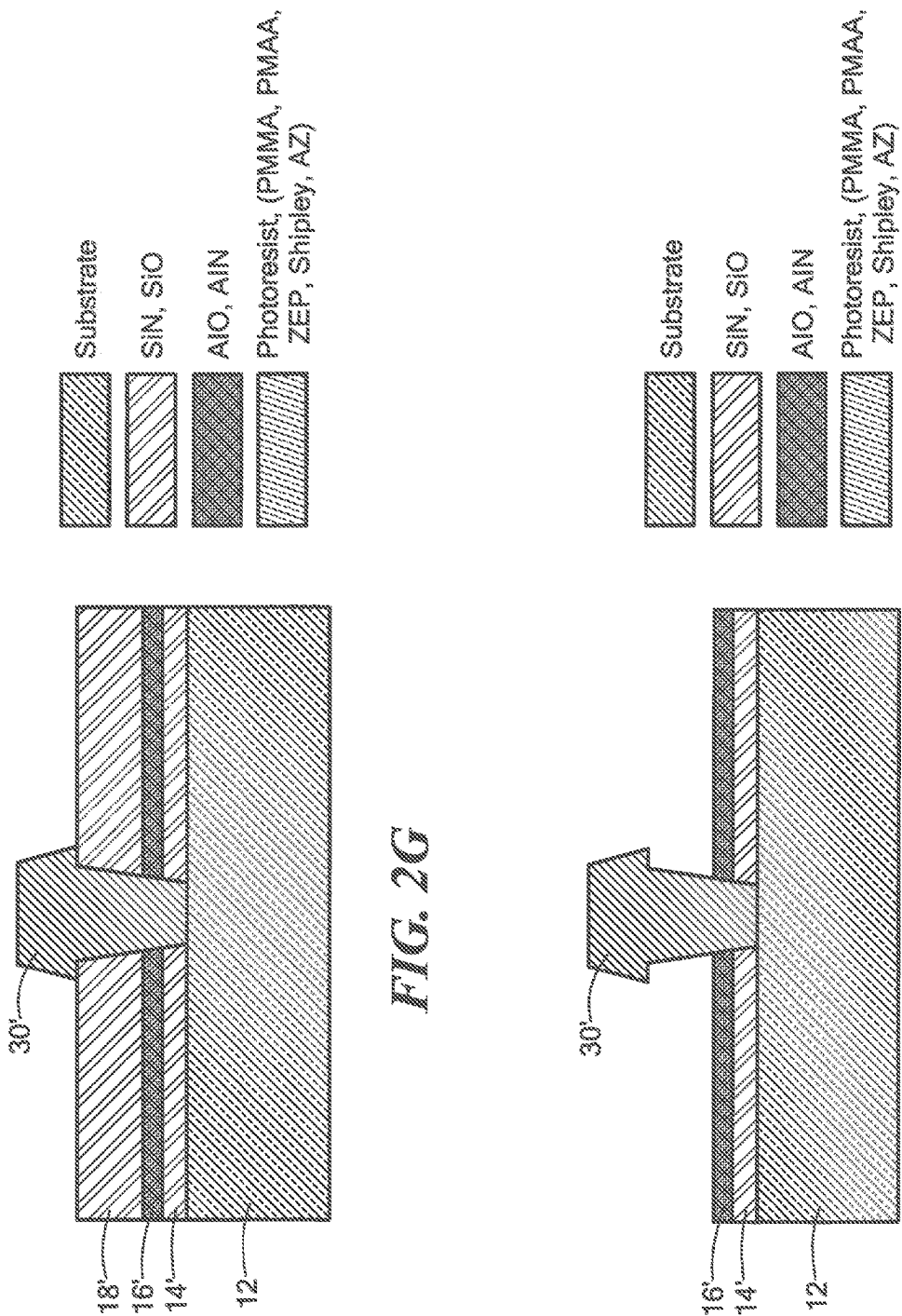

US 9,887,089 B2

SEMICONDUCTOR STRUCTURES HAVING T-SHAPED ELECTRODES

RELATED APPLICATIONS

This application is a Divisional application of U.S. patent application Ser. No. 14/184,793 entitled SEMICONDUCTOR STRUCTURES HAVING T-SHAPED ELECTRODES, filed on Feb. 20, 2014, which is incorporated herein by reference in its entirety.

TECHNICAL FIELD

This disclosure relates generally to semiconductor structures and more particularly to semiconductor structures having T-shaped electrodes.

BACKGROUND

As is known in the art, High speed FETs (Field Effect Transistors) and HEMTs (High Electron Mobility Transistors), that are used for high speed microwave and millimeter-wave systems and applications, generally require that the gate channel length be as short as possible in order to increase the operating frequency of the transistor because the short gate channel length reduces the distance that electrons transfer under the gate between the source and drain regions. In many application, a T-shaped gate electrode (sometimes referred to as a T-gate or mushroom gate) is used for these high speed transistors because they have a small stem making Schottky contact to the semiconductor, to thereby define the gate channel length, but have a much larger top metal to provide low gate resistance.

As is also know in the art, conventional electron beam or chemical photolithographic processing methods used to form sub 100 nm T-gates include the use of a sequence of photolithographic masking steps typically including coating the semiconductor structure or substrate with three different layers of photoresists. Each photoresist layer has a different sensitivity to electron beam exposure thereby enabling selective removal by the electron beam. As shown in FIGS. 1A-1C, three different electro-beam photoresist layers have been coated; each having a different sensitivity to electron beam exposure. After exposing the coated photoresist layers with an electron beam, each layer is developed using a chemical developer starting from top layer, middle layer and bottom layer in sequence as shown in FIGS. 1B-1D. It is noted that length of the top of the T-gate is defined in FIG. 1C and that the length of the stem of the T-gate and hence the gate channel length is defined in FIG. 1D. Metal is then deposited using evaporation technology resulting in the structure shown in FIG. 1E. The metal layer on top of photoresist is then lifted off and T-gate is thereby formed on top of substrate as shown in FIG. 1F. This method has several drawbacks. First, due to high aspect ratio between the cross section of T-gate top and the length of the gate making Schottky contact with semiconductor material, the mechanical stability of the T-gate is weak. This mechanically weak T-gate structure therefore has a high probability of being damaged by any subsequent processes, and thereby leads to low chip yield. A second drawback of this T-gate formation process is that the gate length may vary by subsequent processing; for example, oxygen ash process. More particularly, after development of the photoresist, any residual photoresist is removed using an oxygen plasma process. During the oxygen process, however, the oxygen process may also etch off the photoresist that is patterned by photolithography to form the T-gate before metal deposition. Without using this oxygen process, the gate metal could be deposited on top of photoresist causing poor transistor performance. A chemical recess etch process, which is needed before gate metal deposition to fabricate FETs (Field Effect Transistors), may alter the T-gate formation and lead to non-uniform gate length formation and eventually poor yield. A third drawback is that the subsequent processing after T-gate formation may later damage the exposed area between gate metal and source/drain metals. For example, a subsequent photolithographic process may be left on the semiconductor surface as residues when a conventional T-gate process is used to form T-gate. It is very difficult to clean up any of these residues around a sub-100 nm T-gate without damaging or altering the T-gate and the semiconductor surface. A fourth drawback is that electron-beam photoresist has relatively poor film adhesion to substrate and therefore the conventional processing method used to form T-gates may introduce chemicals between the photoresist and substrate, and causes the photoresist peeling off from the substrate.

SUMMARY

A semiconductor structure is disclosed having a T-shaped electrode. The electrode has a top portion and a narrower stem portion extending from the top portion to a surface of a substrate. A solid dielectric layer has side portions juxtaposed and abutting sidewalls of a lower portion of the stem of electrode. A bottom surface of the top portion is spaced from an upper surface portion by a non-solid dielectric, such as air.

In one embodiment, a method is provided for forming a T-shaped electrode for a semiconductors structure. The method includes: photolithographically forming a first window through a stack of three dielectric layers to expose an underlying surface portion of a substrate, a middle one of the three layers having an etch rate slower than an etch rate of an upper one of the three layers to a predetermined etchant; forming a photoresist layer on an upper one of the dielectric layers and onto the exposed surface portion of the substrate; forming a second window, the second window being in a portion of the photoresist layer in registry with the first window to again expose the surface portion of the substrate with another portion of the photoresist layer being an portions of the upper one of the dielectric layer adjacent to the second window; depositing a metal through the first window and through the second window onto the exposed portion surface portion of the substrate, portions of the metal being deposited on the said another portion of the photoresist layer, a bottom portion of the metal being juxtaposed sidewalls of the lower dielectric layer forming a portion of the second window; lifting off the photoresist layer from the upper one of the three dielectric layers along with the with the portions of the metal deposited on the said another portion of the photoresist layer, exposing the upper one of the dielectric layers to a first etchant to selectively remove the upper one of the three dielectric layers, the etchant stopping at, or in the middle one of the three dielectric layers.

In one embodiment, the method includes: exposing the middle one of the three dielectric layers to an etchant different from the first-mentioned etchant to remove the middle one of the dielectric layers, the different etchant stopping at, or in, the lower one of three dielectric layers.

With such arrangement, a stable high yield sub-100 nm T-gate process is provided using dielectrics having different etch rate among the dielectric films. The dielectric film works as a passivation layer and at the same time it gives a strong mechanical support to the small foot print T-gate. In addition, the dielectric film layer protects the semiconductor surface from any potential damage caused by the following process steps.

Further, having air between the bottom of the top of the gate and the solid dielectric layer spaced from the bottom of the top of the gate, reduces a parasitic capacitance formed by the dielectric layers underneath top of the T-gate.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1A-1F are simplified cross sectional views of the steps of processing a semiconductor structure to form a T-gate electrode in accordance with the PRIOR ART; and FIGS. 2A-2I are simplified cross sectional views of the steps of processing a semiconductor structure to form a T-gate electrode in accordance with the disclosure.

Like reference symbols in the various drawings indicate like elements.

DETAILED DESCRIPTION

Figure 1D:
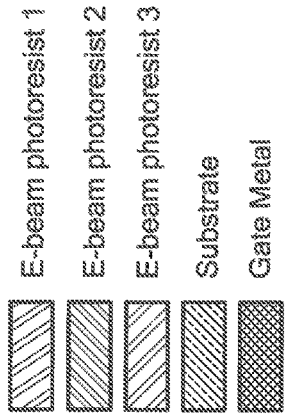
Figure 1D:
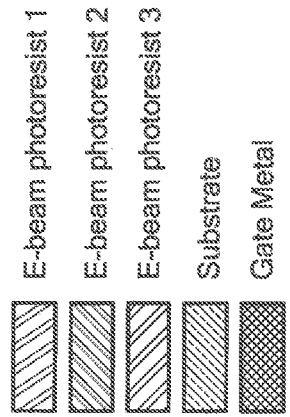
Figure 1D:
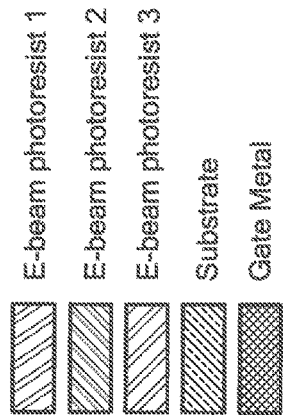
Figure 1D:
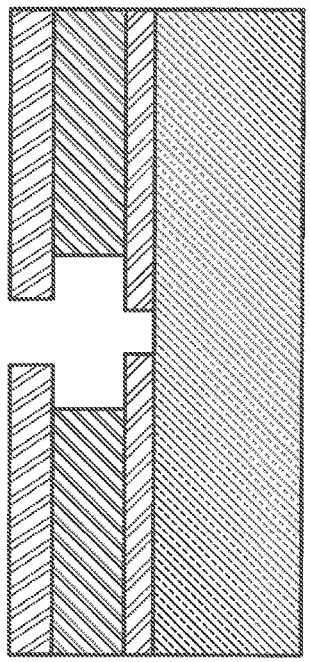
Figure 1E:
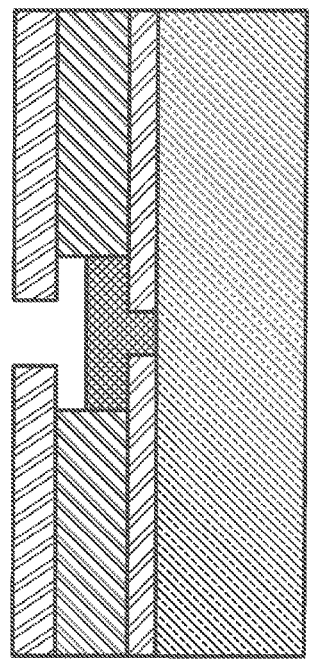
Figure 1F:
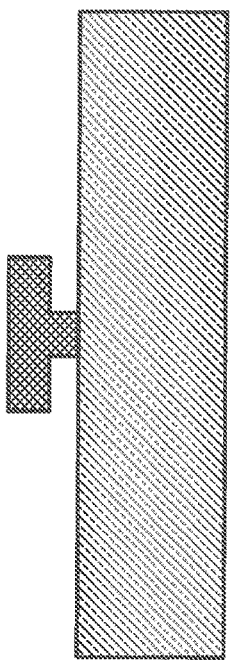
Figure 2A:
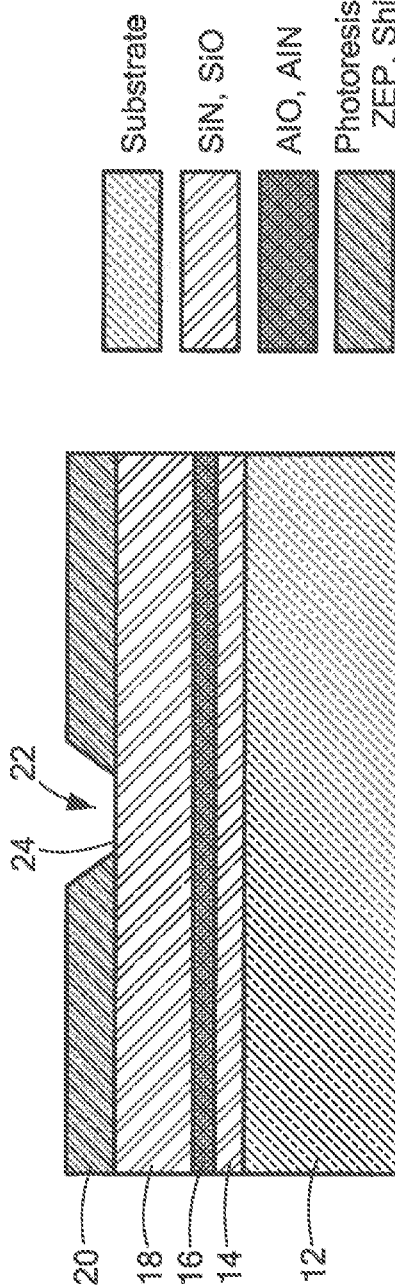

Referring now to FIG. 2A, a semiconductor substrate 12, here for example I-V compounds (GaAs, InP), Si, III-N compounds (GaN, InN, AlN) is shown, having a first dielectric layer 14, here for example silicon oxide or silicon nitride, for example, disposed on the upper surface of the substrate 12, a second dielectric layer 16, here for example, aluminum oxide or aluminum nitride, disposed on the upper surface of layer 14, and a third dielectric layer 18, disposed on the upper surface of the second dielectric layer 16, here layer 18 is for example silicon oxide or silicon nitride. It is noted that there is significant (two orders of magnitude differences; 1:100) in etch rate selectivity between the aluminum oxide or aluminum nitride layers 16 and the silicon nitride or silicon dioxide layers 14 and 18.

Next, a photoresist layer 20 is deposited over the upper surface of the layer 18 and patterned into a mask, using conventional photolithography, having a window 22 with inwardly slopping sidewalls, the window exposing an underlying portion 24 of the upper surface of layer 18, as shown.

Figure 2B:
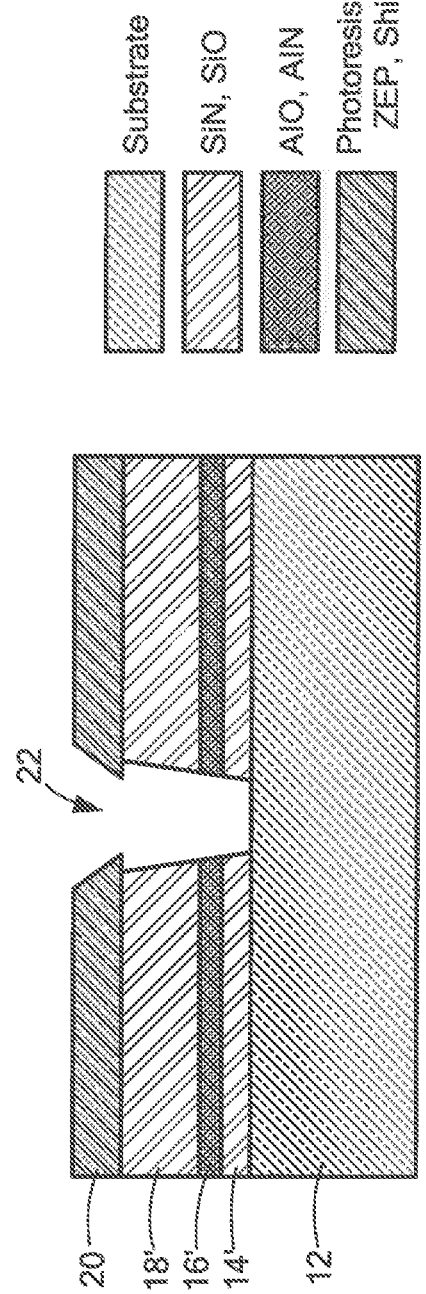

Next, referring to FIG. 2B, the upper surface of the mask formed in layer 20 is subjected a sequence of etching away exposed portions of the layers 18, 16 and 14.

More particularly, the exposed portion of the silicon nitride or silicon oxide layer 18 is etched with etch chemistry. here a dry or gaseous chemistry, such as reactive ion etching (RIE) or plasma etching, for example, having high etch selectivity between silicon nitride or silicon oxide layer 18 and aluminum oxide or aluminum nitride layer 16, such as Sulfur hexafluoride (SF6), using photoresist as a mask. The etching stops at the aluminum oxide or aluminum nitride layer 16 because the etch chemistry slows down the etching process in etching of aluminum oxide or aluminum nitride layer 16 due to high etch selectivity between aluminum oxide or nitride and silicon nitride or oxide; the chemistry etches the silicon nitride or silicon oxide layer 18 almost 100 times faster than to etch the aluminum oxide or aluminum nitride layer 16. Next, a different chemistry is used, such as boron trichloride ($BCl_3$) to etch the exposed portion of the aluminum oxide or aluminum nitride layer 16. This etch chemistry has much low selectivity between aluminum oxide or nitride layer 16 and the silicon nitride or oxide layer 14. Using both the photoresist layer 20 and layer 18 as etch masks, layer 16 is etched off from layer 14. The exposed portion of the bottom silicon dioxide or silicon nitride layer 14 is etched with the same etch chemistry used to etch layer 18, such as SF6 using aluminum oxide or nitride layer 16 as a mask. By utilizing this etch selectivity and etching chemistry, three dielectric layer 14', 16' and 18' are formed, as shown in FIG. 2B.

Figures 2C, 2D:
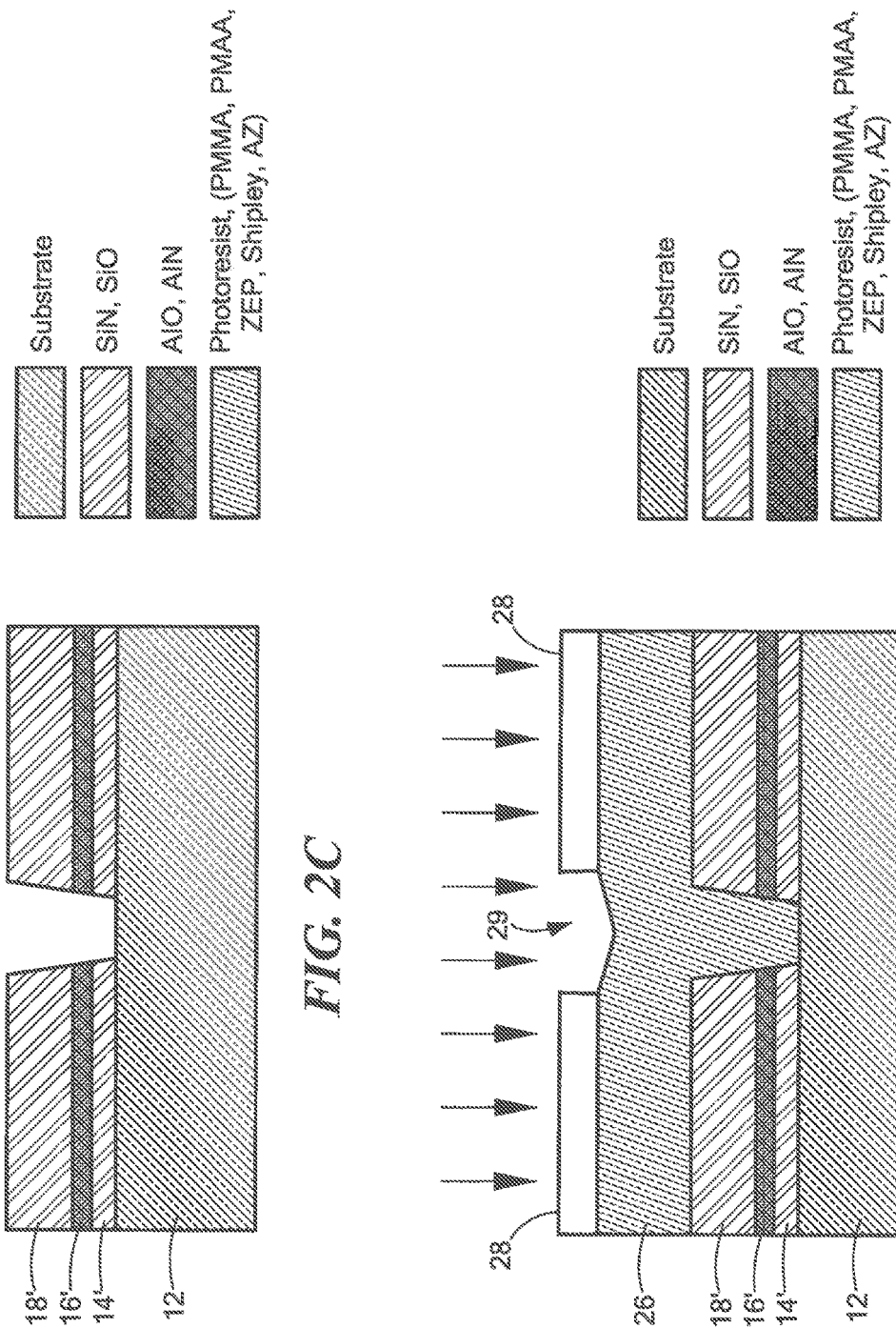

Next, the photoresist mask 20 is stripped from the structure in FIG. 2B leaving the structure shown in FIG. 2C.

Next, a photoresist layer 26, here for example, PMMA, PMAA, ZEP or Shipley, or AZ photoresist in order to form negative slope, image reversal photolithography technology is spread over the upper surface of the structure shown in FIG. 2C, as shown in FIG. 2D. Next, a mask 27 is formed over the photoresist layer 20, as shown, and a window 29 is formed in layer 26 using the mask 27 and conventional reverse image lithography, here forming a window 29 aligned, or in registry with, sidewalls that slope outwardly in a dove-tail shape exposing the upper surface of layer 18', as shown for a subsequent metal lift off step to be described in connection with FIG. 2F using conventional image reversal photolithography and electron beam exposure for PMMA, PMAA, or ZEP photoresist. It is noted that the window 29 is formed so that the developer of the photoresist layer 27 just removes the portion of the photoresist material of layer 20 exposed by the mask 28, patterning layer 26 into layer 26' as shown in FIG. 2E.

Figures 2E, 2F:
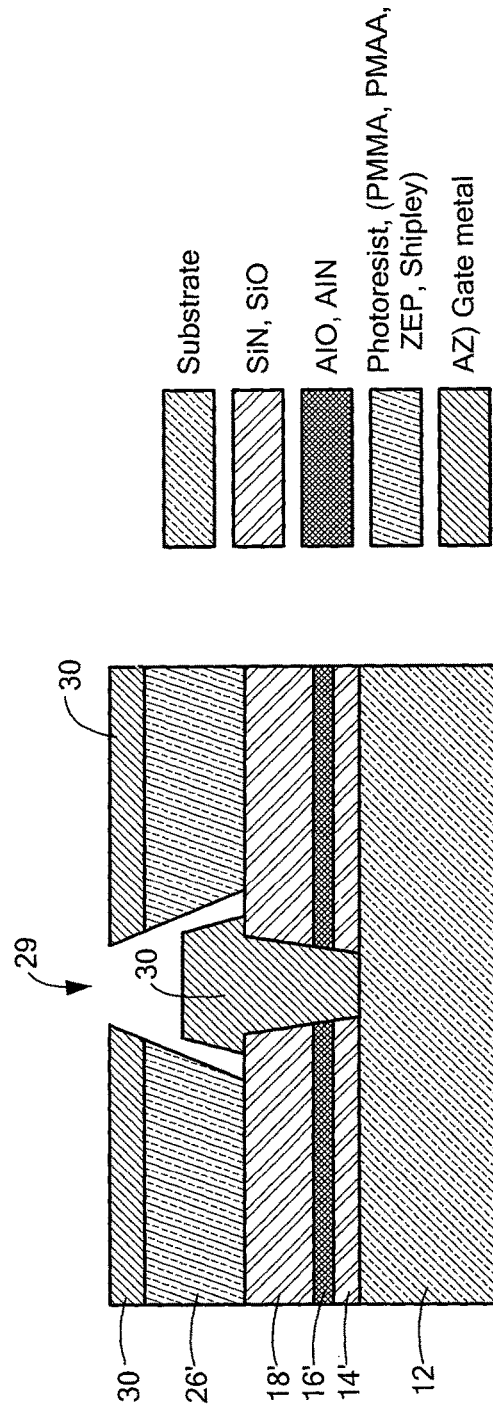

Next, referring to FIG. 2F, a gate electrode metal 30, here, aluminum, gold, or titanium, platinum, molybdenum, for example, is deposited, such as by evaporation, over the upper surface of the structure shown in FIG. 2E, as shown in FIG. 2F; it being noted that the portions of the deposited metal become deposited on layer 26' and other portions pass through window 29 onto exposed portions of layer 18', as shown. It is noted that the walls of the top of the gate spread outwardly because of the spreading of the light as it passes through the window 29. Next, referring to FIG. 2G, the photoresist layer 26' (FIG. 2F) is lifted off from the upper surface of layer 18', along with the portions of the metal layer 30 on the photoresist layer 26', leaving the structure shown in FIG. 2G having a T-shaped gate 30'.

Next, referring to FIG. 2H, the silicon oxide or silicon nitride layer 18' is removed using a gas chemistry, such as SF6, that etches silicon dioxide or silicon nitride dielectric films 100 times faster than aluminum oxide and aluminum nitride. So the process etches off the silicon nitride or silicon oxide layer 18' on top of aluminum oxide or aluminum nitride layer 16'. The etch chemistry slows down at aluminum oxide or aluminum nitride layer 16' because the gas chemistry, such as SF6, can hardly etch aluminum oxide or aluminum nitride layer 16' due to high etch selectivity between aluminum oxide or nitride and silicon nitride or oxide. Thus, the aluminum oxide or aluminum nitride in layer 16' serves as an etch stop layer. With removal of layer 18', parasitic capacitance, which is a critical parameter adversely affecting the transistor performance for microwave and millimeter-wave application, is eliminated. The T-gate structure as shown in FIG. 2H can be a final product with both layers 16' and 14' supporting the bottom of T-gate for mechanical stability. If it is necessary to remove layer 16', it can be done with the following method by using different gas chemistry.

Figure 2I:
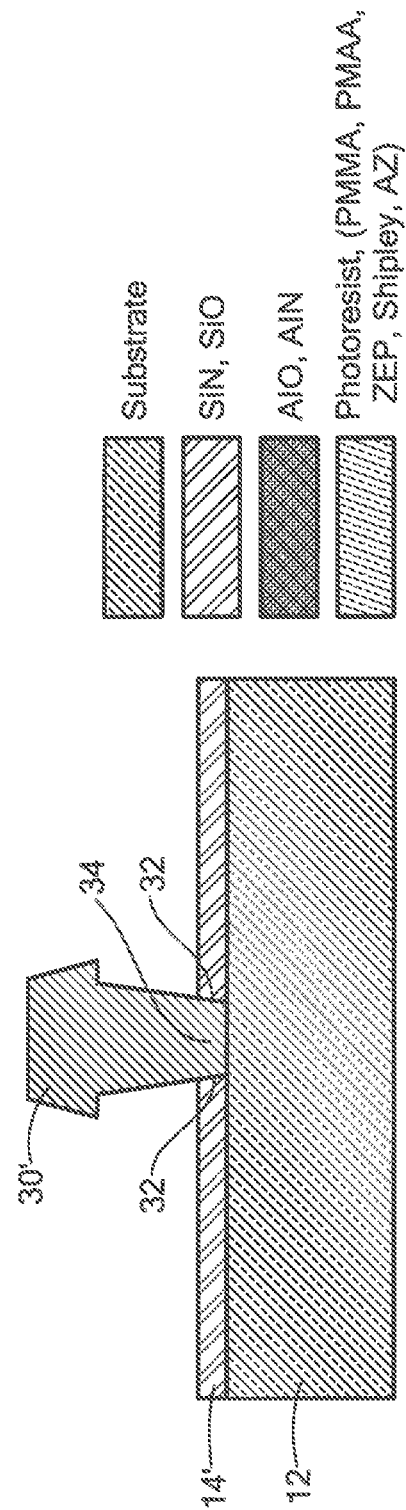

The aluminum oxide or aluminum nitride in layer 16' is removed using a different chemistry, such as $BCl_3$, to etch the exposed portion of the aluminum oxide or aluminum nitride layer 16' on top layer 14', which is silicon oxide or silicon nitride. This etch chemistry has much low selectivity between aluminum oxide or nitride layer 16' and the silicon nitride or oxide layer 14'. The etch rate of the silicon oxide or silicon nitride layer 18' using the gas chemistry, such as $BCl_3$, is 3 times slower than the etch rate of the aluminum oxide or aluminum nitride in layer 16' leaving the structure shown in FIG. 2I. It is noted that the layer 14' has sidewalls 32 that abut the bottom stem portion 34 of the T-gate 30'. This abutment by the sidewalls 32 provides a stable high yield sub-100 nm T-gate process using dielectrics having different etch rate among the dielectric layer layers 14, 16 and 18. The dielectric layer 14' also serves as a passivation layer for the substrate 10 and at the same time it gives a strong mechanical support to the small foot print Schottky contact region of the T-gate 30'. In addition, the dielectric layer 14' protects the semiconductor surface from any potential damage caused by the following process steps, such as formation of the source and drain electrodes, not shown, as well as for electrical interconnection to other passive and active, not shown, in an MMIC application, for example.

It is noted that thickness of each of the layers 14, 16 and 18 can be varied and optimized for each transistor or device technology and applications. It is also noted that layer 16'; (FIG. 2H) need not be removed. The formed T-gate 30' can be used as a final product by using the bottom layer 14'; or the bottom two dielectric layers 16' and 14' as passivation layer and mechanical supporting layer.

This T-gate formation process has several advantages: it is highly compatible for manufacturing small sub-100 nm T-gate without worrying about gate damage; the semiconductor substrate surface is not exposed during T-gate formation, so a subsequent process doesn't damage or alter the semiconductor surface; the bottom one or two layers 14' 16' provide mechanical support by surrounding the gate; and photoresist residues generated on top of dielectric films during the gate process can be easily removed; and, unlike conventional T-gate process using photoresist, here, in accordance with the disclosure, the dielectric films make direct contact to the substrate removing problems associated with poor adhesion of photoresist to the substrate.

A number of embodiments of the disclosure have been described. Nevertheless, it will be understood that various modifications may be made without departing from the spirit and scope of the disclosure. For example, while the process has been described in forming a gate for a field effect transistor the process may be used for other devices. Accordingly, other embodiments are within the scope of the following claims.

What is claimed is:

1. A method for forming a T-shaped electrode for a semiconductor structure, comprising:
    forming a first window through a stack of dielectric layers to expose an underlying surface portion of a substrate, the stack of dielectric layers comprising: an upper dielectric layer; a lower dielectric layer; and an intermediate dielectric layer disposed between the upper dielectric layer and the lower dielectric layer, the upper dielectric layer having an etch rate higher than an etch rate of the intermediate dielectric layer to a predetermined etchant;
    forming a photoresist layer over the stack of dielectric layers and through the first window onto the exposed underlying surface portion of the substrate;
    forming a second window, the second window being in a portion of the photoresist layer in registry with the first window to again expose the underlying surface portion of the substrate with another portion of the photoresist layer being on portions of the upper dielectric layer adjacent to the second window;
    depositing a metal through the first window and through the second window onto the exposed underlying surface portion of the substrate, portions of the metal being deposited on the said another portion of the photoresist layer, a bottom portion of the metal being juxtaposed sidewalls of the upper dielectric layer, the lower dielectric layer, and the intermediate dielectric layer;
    lifting off the photoresist layer from the upper dielectric layer along with the portions of the metal deposited on the said another portion of the photoresist layer;
    exposing the upper dielectric layer to the predetermined etchant to selectively remove the upper dielectric layer, the predetermined etchant stopping at the intermediate dielectric layer; and
    exposing the intermediate dielectric layer to an etchant different from the predetermined etchant to remove the intermediate dielectric layer, the different etchant stopping at, or in, the lower dielectric layer.

2. The method recited in claim 1 wherein the upper dielectric layer comprises silicon nitride, the intermediate dielectric layer comprises aluminum oxide, and the lower dielectric layer comprises silicon nitride.

3. A method for forming a T-shaped electrode for a semiconductor structure, comprising:
    forming a first window through a stack of three dielectric layers to expose an underlying surface portion of a substrate, a middle one of the three layers having an etch rate lower than an etch rate of an upper one of the three dielectric layers to a predetermined etchant;
    forming a photoresist layer on the upper one of the three dielectric layers and onto the exposed surface portion of the substrate;
    forming a second window, the second window being in a portion of the photoresist layer in registry with the first window to again expose the surface portion of the substrate with another portion of the photoresist layer being on portions of the upper one of the three dielectric layers adjacent to the second window;
    depositing a metal through the first window and through the second window onto the exposed surface portion of the substrate, portions of the metal being deposited on the said another portion of the photoresist layer, a bottom portion of the metal being juxtaposed sidewalls of the three dielectric layer;
    lifting off the photoresist layer from the upper one of the three dielectric layers along with the with the portions of the metal deposited on the said another portion of the photoresist layer;
    exposing the upper one of the dielectric layers to the predetermined etchant to selectively remove the upper one of the three dielectric layers, the predetermined etchant stopping at, or in the middle one of the three dielectric layers.

4. The method recited in claim 3 including:
    exposing the middle one of the three dielectric layers to an etchant different from the predetermined etchant to remove the middle one of the three dielectric layers, the different etchant stopping at, or in, the lower one of three dielectric layers.

5. The method recited in claim 3 wherein the upper one of the three dielectric layers comprises silicon nitride, the middle layer of the three dielectric layer comprises aluminum oxide, and the lower one of the three dielectric layers comprises silicon nitride.

6. The method recited in claim 3 wherein the predetermined etchant comprises sulfur hexafluoride ($SF_6$) and the etchant different from the predetermined etchant comprises ammonia ($NH_4OH$).

7. The method recited in claim 3 wherein the predetermined etchant comprises sulfur hexafluoride ($SF_6$) and the etchant different from the predetermined etchant comprises ammonia ($NH_4OH$).

* * * * *